US006551898B1

(12) United States Patent
Hughes et al.

(10) Patent No.: US 6,551,898 B1
(45) Date of Patent: Apr. 22, 2003

(54) CREATION OF A POLARIZABLE LAYER IN THE BURIED OXIDE OF SILICON-ON-INSULATOR SUBSTRATES FOR THE FABRICATION OF NON-VOLATILE MEMORY

(75) Inventors: Harold L. Hughes, West River, MD (US); Patrick J. McMarr, Alexandria, VA (US); Reed K. Lawrence, Leesburgh, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/985,023

(22) Filed: Nov. 1, 2001

(51) Int. Cl.[7] ............................................. H01L 21/76
(52) U.S. Cl. ..................... 438/407; 438/404; 438/295; 438/517
(58) Field of Search .................. 438/257, 295, 438/404, 407, 473, 474, 517

(56) References Cited

U.S. PATENT DOCUMENTS

| 5,464,792 A | | 11/1995 | Tseng et al. | |
| 5,633,174 A | | 5/1997 | Li | |
| 5,656,845 A | * | 8/1997 | Akbar | 257/315 |
| 5,691,552 A | * | 11/1997 | Oyama | 257/316 |
| 5,795,813 A | | 8/1998 | Hughes et al. | |
| 5,852,346 A | * | 12/1998 | Komoda et al. | 315/169.3 |
| 5,960,265 A | * | 9/1999 | Acovic et al. | 438/157 |
| 6,248,642 B1 | | 6/2001 | Dolan et al. | |
| 6,252,275 B1 | | 6/2001 | Aitken et al. | |

OTHER PUBLICATIONS

P.J. McMarr, "SOI Non–volatile Memory" Proceedings Non–Volatile Memory Technology, Syp–2000, pp. 15–16 Nov. 2000.

* cited by examiner

*Primary Examiner*—Trung Dang
(74) *Attorney, Agent, or Firm*—John J. Karasek; Stephen T. Hunnius

(57) ABSTRACT

This invention concerns a process of forming a polarizable layer in a buried oxide layer of a silicon-on-insulator substrate for the fabrication of non-volatile memory. This process comprises implanting, through the active silicon layer, Si ions into the buried oxide layer at an ion implantation energy selected so that the implanted ion has its peak concentration between 5–50 nm from the silicon/buried oxide interface. The implantation step can occur while externally heating the silicon-on-insulator substrate at a temperature between 25–300 degrees Celsius. After implantation, an annealing step may be completed to repair any damage the implantation may have created in the silicon-on-insulator substrate.

7 Claims, No Drawings

CREATION OF A POLARIZABLE LAYER IN THE BURIED OXIDE OF SILICON-ON-INSULATOR SUBSTRATES FOR THE FABRICATION OF NON-VOLATILE MEMORY

BACKGROUND OF THE INVENTION

1. Field of the Invention

The present invention relates generally to silicon-on-insulator structures, and more specifically to processing a polarizable layer in the buried oxide of silicon-on-insulator substrates for the fabrication of non-volatile memory.

2. Discussion of the Background

There are various types of commercial non-volatile memory that have been fabricated on bulk silicon, but no commercial non-volatile memories have been fabricated on SOI substrates that utilize a polarizable layer in the buried oxide in their operation.

Two known techniques for forming the buried oxide layer in SOI substrates are the implantation of oxygen ions in the separation-by-implantation-of-oxygen process (SIMOX) and the method of first growing a thermal oxide and then bonding. The difficulty is that the buried oxide formed using either of these commercial processes are non-polarizable.

The test for the polarizability of the buried oxide is (1) the fabrication of point-contact transistors, (2) measurement of the transistor characteristics, (3) application of a positive poling voltage to the back-gate or drain above the operating voltage and (4) remeasurement of the transistor characteristics. The procedure is then repeated, where a negative poling voltage of the same magnitude is applied to the back-gate or drain. Any significant reproducible hysteresis in the transistor characteristics indicates that the buried oxide has been polarized. These measurements were performed on a wide range of commercially available SOI substrates, and demonstrate that the buried oxides of these substrates are non-polarizable.

In the SIMOX process, a thin layer of a monocrystalline silicon substrate is separated from the bulk of the substrate by implanting oxygen ions into the substrate to form a buried dielectric layer. The SIMOX process provides a heterostructure in which a buried silicon dioxide layer serves as a highly effective insulator for surface layer electronic devices.

In the SIMOX process, oxygen ions are implanted into silicon, after which the material is annealed to form the buried silicon dioxide layer or BOX region. The annealing phase redistributes the oxygen ions such that the silicon/silicon dioxide boundaries become smoother and more abrupt, thus forming a sharp and well-defined BOX region.

One important criterion for SIMOX wafers is the defect density, which should be minimized in order to produce high quality wafers. Defect density can be defined in terms of the departure from perfect crystallinity in the silicon layer that is separated from the bulk substrate by the buried oxide layer. In general, as the oxygen ions are implanted into the wafer to produce the buried $SiO_2$ layer, atomic silicon is displaced. Additionally, excess silicon atoms from the growing BOX region can alter the crystal structure of the top silicon layer resulting in a variety of point and extended defects, such as threading dislocations and stacking faults, during the ion implantation and/or annealing processes. These defects degrade the quality and reliability of devices. e.g., transistors, that are subsequently formed in the upper silicon layer.

It is known that, in the SIMOX substrate, structure and quality of the buried oxide layer formed under the top silicon layer by implanting the oxygen ions into the single-crystal silicon substrate depend on an ion implanting quantity (dose of ions), so that the dose of oxygen ions as $10^{17}$–$10^{18}$/cm$^2$ is required in order to form the buried oxide layer having the abrupt interface. But, there is the disadvantage of producing crystal defects in the top single-crystal silicon layer when the dose of ions is increased, and observing the relation of a crystal dislocation density and the dose of ions, when the dose of ions reaches over $1.0 \times 10^{18}$/cm$^2$, the dislocation density is increased and crystal quality of the top silicon layer where device elements are formed is inferior. When the dose of ions is controlled within the range between $0.5 \times 10^{18}$/cm$^2$ and less than $1.0 \times 10^{18}$/cm$^2$ in order not to produce the crystal defect, a breakdown electric field of the buried oxide layer is smaller and the breakdown voltage is decreased. Consequently, as a condition capable of obtaining the high breakdown electric field of the buried oxide layer and of achieving the low dislocation density in the top silicon layer, at an acceleration energy of 150–200 keV, for example, the ion implantation has been practiced by setting the dose of ions at around $0.4 \times 10^{18}$/cm$^2$ (J. Mater. Res., Vol. 8, No. 3, 1993 pp. 524–534).

If a polarizable layer is formed in the buried oxide, then the polarizable layer/buried oxide combination can be used for the fabrication of non-volatile memory.

SUMMARY OF THE INVENTION

Accordingly, it is one object of the present invention to provide a novel process for creating a polarizable buried oxide in SOI substrates.

It is another object of this invention to provide a process for creating a polarizable buried oxide in SOI substrates by the implantation of ions.

It is another object of this invention to provide a process for creating a polarizable buried oxide in SOI substrates by the implantation of silicon ions into the buried oxide.

It is another object of this invention to provide a process for creating a polarizable buried oxide in SOI substrates by the channeling and implantation of ions such that damage effects to the top silicon region are reduced.

These and other objects, which will become apparent during the following detailed description, have been achieved by the inventors' discovery that a polarizable buried oxide layer in a SOI substrate may by prepared by:

externally heating the silicon-on-insulator substrate;

implanting ions into the buried oxide layer; and annealing the silicon-on-insulator substrate.

DETAILED DESCRIPTION OF THE PREFERRED EMBODIMENTS

The present invention provides a process for forming a polarizable layer in a buried oxide layer of a silicon-on-insulator substrate for the fabrication of non-volatile memory, the process comprising:

externally heating the silicon-on-insulator substrate;

implanting ions into the buried oxide layer; and annealing the silicon-on-insulator substrate.

A typical SOI includes a silicon substrate, an active silicon layer, and a buried oxide layer sandwiched between the active silicon layer and the silicon substrate. Generally, the buried oxide layer rests directly on and physically contacts the silicon substrate. Also, the active silicon layer generally rests on and physically contacts the buried oxide layer. The buried oxide layer electrically isolates the active silicon layer from the silicon substrate.

During the implantation stage, the dose of the implanted ion should be as high as can be obtained without damaging the active Si layer to such an extent that a subsequent anneal will not essentially rectify the damage.

Channeling of the ions during the implantation stage may minimize the damage to the active Si layer. Channeling, however, is not required according to the present invention.

The depth of the implant is determined by the energy. The implant energy required to obtain the desired implantation profile in the buried oxide layer will vary depending upon the implanted species, the thickness of the active Si layer and the angle of implantation. Other factors, such as the density of the buried oxide layer may also effect the required implantation energy. Thus, the energy required to obtain the desired implantation profile in the BOX is best determined empirically for each situation, using the knowledge of those skilled in the art of ion implantation. Typically, the peak implant concentration is 5 to 50 nm from the top silicon/ buried oxide interface. Most typically, the peak implant concentration is about 20 nm from the top silicon/buried oxide interface.

Typically, the step of externally heating the substrate is carried out at temperatures of 25 degrees Celsius to 300 degrees Celsius.

Typically, the step of implanting is carried out such as to supply a dose of ions of $1\times10^{15}$ cm$^{-2}$ to $1\times10^{17}$ cm$^{-2}$, depending on the desired poling voltage of the MOS transistor fabricated on the top-silicon.

Typically, the step of annealing is carried out at temperatures of 900 degrees Celsius to 1000 degrees Celsius. Annealing removes residual damage in the active Si layer and stabilizes the Si-implanted buried oxide layer. At temperatures below about 800 degrees Celsius, no significant annealing occurs. At high temperatures, either the Si active layer melts or contamination becomes a greater concern. Generally, annealing is performed for about 1–5 hours. If the annealing time is overly long, the Si in the substrate may begin to reduce the BOX layer. Generally, the post-implantation anneal is performed either in vacuo or under an atmosphere that is non-reactive with the SOI structure.

EXAMPLE

Following initial electrical characterization of SIMOX substrates, the substrates were implanted with silicon ions at doses of $5\times10^{15}$ and $1\times10^{16}$ ions/cm$^2$ at 130 keV. The SIMOX substrates selected for implantation had a top silicon thickness of ~1500 Å and a buried oxide thickness of ~1700 Å. For this system, at 130 keV, TRIM and SILVACO simulations showed that the majority of the silicon ions would be implanted into the buried oxide. SIMS analysis confirmed that ~90% of the ions were implanted in the top 600 Å of the buried oxide. The temperature of the SIMOX substrates during implantation was 200 degrees C. The ions were channeled to minimize damage in the top silicon of the substrate. To determine if the electrical properties of the substrates were degraded by the high dose implantations, SIS structures were fabricated on the implanted substrates and PCT transistor measurements performed. There was a small change in the subthreshold swing, which corresponds to a back-channel interface state density of ~$3\times10^{11}$ cm$^{-2}$ eV$^{-1}$. The magnitudes of the currents above the subthreshold region are essentially identical for the implanted and unimplanted substrates, indicating that the implantation process does not seriously impact carrier mobility.

Obviously, many modifications and variations of the present invention are possible in light of the above teachings. It is therefore to be understood that, within the scope of the appended claims, the invention may be practiced otherwise than as specifically described.

We claim:

1. A process of forming a polarizable layer in a buried oxide layer of a silicon-on-insulator device, said device including a silicon substrate, an active silicon layer, and a buried oxide layer sandwiched between said silicon substrate and said active silicon layer, for the fabrication of non-volatile memory, said process comprising:

implanting, through said active silicon layer, silicon ions into said buried oxide layer at an ion implantation energy selected so that said implanted ion has its peak concentration between 5–50 nm from the silicon/buried oxide interface; and annealing said silicon-on-insulator device.

2. The process of claim 1, wherein said implantation is conducted at a temperature between 25 degrees Celsius and 300 degrees Celsius.

3. The process of claim 1, wherein said step of implanting is channeled through the top-silicon layer.

4. The process of claim 1, wherein said step of implanting is carried out such as to supply a dose of ions of $1\times10^{15}$ cm$^{-2}$ to $1\times10^{17}$ cm$^{-2}$, depending on the desired poling voltage of the MOS transistor fabricated on the top-silicon.

5. The process of claim 1, wherein said step of annealing is carried out in an inert atmosphere.

6. The process of claim 5, wherein said inert atmosphere is an argon atmosphere.

7. The process of claim 5, wherein said step of annealing is carried out at temperatures of 900 degrees Celsius to 1000 degrees Celsius.

* * * * *